United States Patent [19]

Pelletier et al.

[11] 4,011,500

[45] Mar. 8, 1977

[54] PHYSICAL DISPLACEMENT SENSING WITH DIFFERENTIAL CAPACITOR

[75] Inventors: Claude Pelletier, Annecy; Roger Velte, Annecy-le-Vieux, both of France

[73] Assignee: Societe Nouvelle de Roulements, France

[22] Filed: Dec. 16, 1974

[21] Appl. No.: 533,231

[30] Foreign Application Priority Data

Dec. 18, 1973 France .............................. 73.45271

[52] U.S. Cl. .............................. 324/61 R; 307/234; 328/133
[51] Int. Cl.² ........................................ G01R 27/26
[58] Field of Search ................. 324/61 R; 307/234; 328/133

[56] References Cited

UNITED STATES PATENTS

| | | | |
|---|---|---|---|
| 2,877,416 | 3/1959 | Grisdale | 328/133 X |
| 2,968,031 | 1/1961 | Higa | 328/133 X |
| 3,219,925 | 11/1965 | Borley et al. | 324/61 R |
| 3,222,591 | 12/1965 | Mynall | 324/61 R X |
| 3,312,892 | 4/1967 | Parnes | 324/61 R |
| 3,452,274 | 6/1969 | Povey | 324/61 R |
| 3,469,196 | 9/1969 | Cowin et al. | 328/133 |
| 3,805,156 | 4/1974 | Norton et al. | 324/61 R |
| 3,845,377 | 10/1974 | Shimotori | 324/61 R X |

*Primary Examiner*—Stanley T. Krawczewicz
*Attorney, Agent, or Firm*—Bucknam and Archer

[57] ABSTRACT

A device for measuring spatial displacement comprises two similar elementary capacitors of a differential capacitor and which share a common movable armature and the two capacitors are used to produce respective pulses whose lengths are compared to produce a third pulse whose length is proportional to the displacement of the armature. In a preferred embodiment, the capacitors are switched in alternation into an oscillating circuit and serve to determine the frequency of oscillation thereof and the time taken for a fixed number of oscillations to be produced with each capacitor switched in is measured to produce the first and second pulses. An adder/subtractor counter is provided which provides a fourth pulse whose length is equal to twice that of the first pulse and the fourth pulse is compared with a pulse whose length equals the sum of the first and second pulses to produce the third pulse.

14 Claims, 3 Drawing Figures

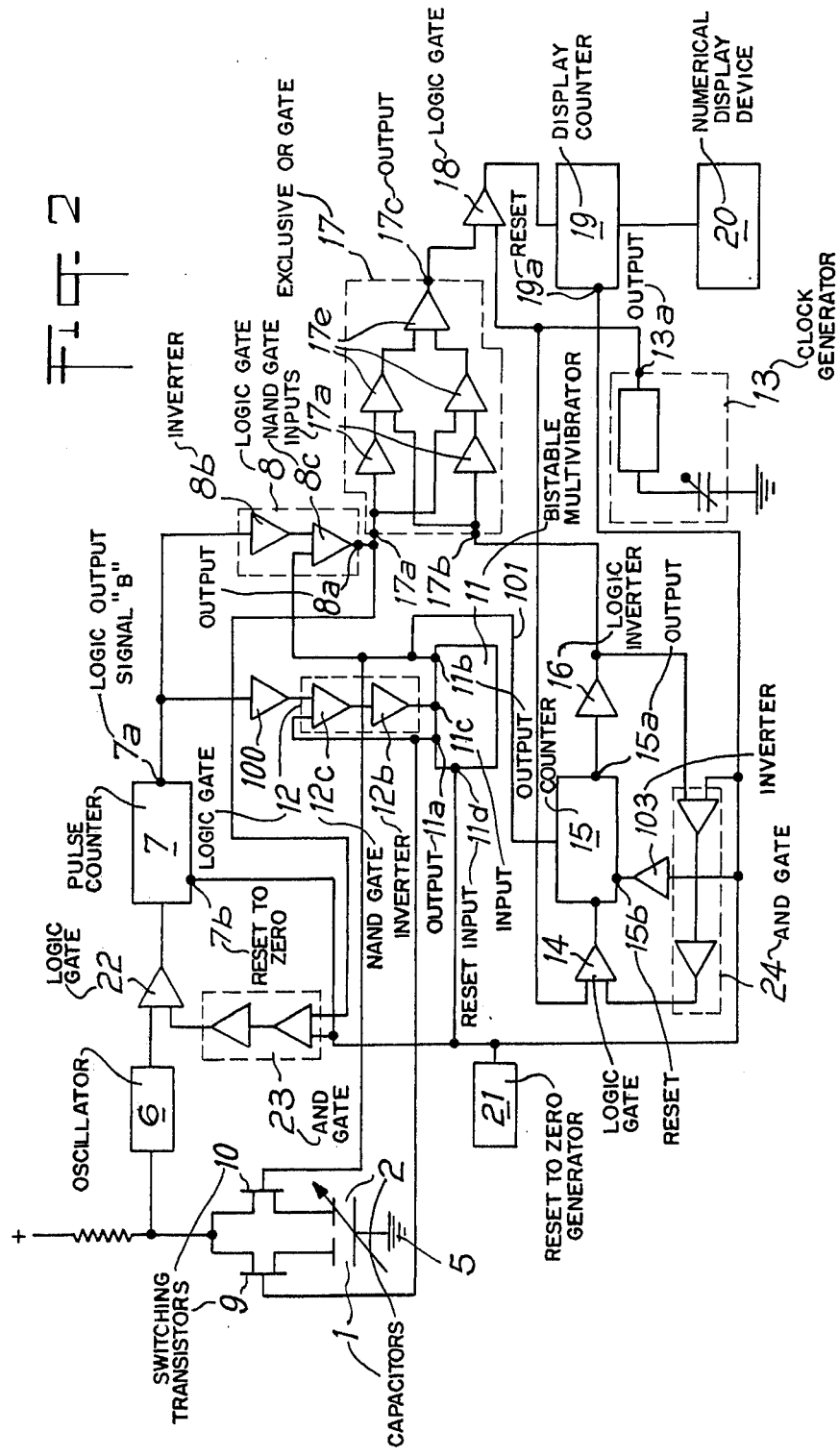

PHYSICAL DISPLACEMENT SENSING WITH DIFFERENTIAL CAPACITOR

The present invention relates to an apparatus and method for performing measurements of a parameter and which produces a digital output. More particularly the invention relates to the measurement of spatial displacement.

Known apparatuses for measuring a dimensional characteristic or spatial displacement, and having digital display facilities are generally formed of three main parts: firstly a pick-up or transducer comprising a body and a sensor which is axially or radially movable in this body and which is associated with a device of which the electrical characteristics vary as a function of the displacement of the sensor; secondly an analogue device which converts the electrical characteristic of the pick-up to an analogue signal e.g. a potential or current which is proportional to the displacement of the axis of the sensor; and thirdly a numerical or digital device which converts the analogue signal to a digital or binary one through the intermediary of conventional analogue-digital conversion devices.

The analogue devices of these known apparatuses may, of necessity be very intricate and expensive requiring very careful design to ensure high accuracy and stability.

According to a first aspect of the present invention there is provided a method of measuring a parameter, comprising the steps of: taking first and second electrical elements which have respective electrical characteristics which vary by substantially the same amount but in opposite senses in response to a variation in the value of the parameter; producing a first pulse whose length is proportional to the parameter-sensitive electrical characteristic of the first element; producing a second pulse whose length is proportional to the parameter-sensitive electrical characteristic of the second element and producing a third pulse whose length corresponds to the absolute value of the difference between the lengths of the first and second pulses.

According to a second aspect of the present invention there is provided an apparatus for measuring a parameter, comprising: first and second electrical elements which have respective electrical characteristics which vary by the same amount but in opposite senses in response to a variation in the value of the parameter; means for producing a first pulse whose length is proportional to the parameter-sensitive electrical characteristic of the first element; means for producing a second pulse whose length is proportional to the parameter-sensitive electrical characteristic of the second element, and means for producing a third pulse whose length corresponds to the absolute value of the difference between the lengths of the first and second pulses.

In a preferred embodiment, the parameter to be measured the displacement from a reference position of a common armature which is associated with two elementary capacitors of a differential capacitor. The capacitances of the elementary capacitors vary by substantially the same amount but in opposite senses in response to a given displacement of the armature.

Advantageously the measuring means may be provided with an oscillator circuit adapted to be connected, via switching means, successively to one or the other of the electric elements, in the preferred case the elementary capacitors, and which is operated in such manner as to form together with the electric element i.e. elementary capacitor to which it is connected a pulse or other signal generator. This generator produces periodic pulses, the freguency of which is a function of the parameter value ($v_1$ or $v_2$) of said electric element. A counter is fed by these pulses and is arranged so that its output assumes one state whilst it is counting and another state when no counting is taking place. Counting ends temporarily as soon as the counter has counted a predetermined number of pulses from the aforementioned generator. The switching means are preferably actuated in combination with the counter so that as soon as the measurement counter has counted the predetermined number of pulses from the generator the second electric element of the pick-up is switched into the oscillator circuit. The switching means may also control a gate connected to the logic output of the counter so that the output of this gate changes state only at the beginning and end of counting.

The invention enables the measuring circuitry to be incorporated in the casing of a pick-up, by means of a very simple circuit. The output pulses may, if desired, then be transmitted via a cable of indefinite length since the outputs of the circuits are in binary (digital) rather than analogue form.

In order that the invention may more clearly be understood, the following description is given, by way of example, with reference to the accompanying drawings in which:

FIG. 2 is a block diagram of an embodiment of apparatus in accordance with the invention.

Figure 1:
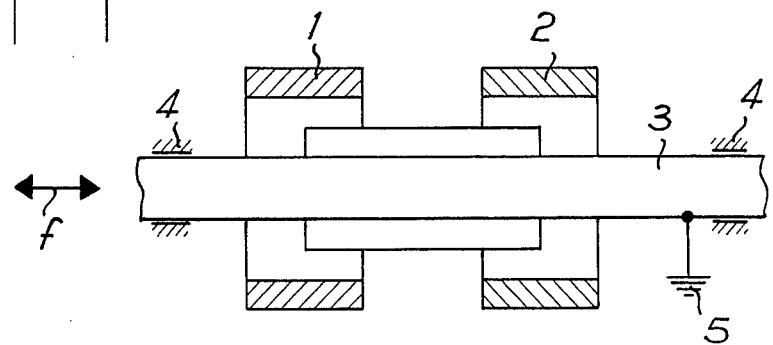
FIG. 1 is a schematic view in section of one embodiment of differential pick-up for use with the invention.

FIG. 1 shows a dimensional or displacement measuring device comprising a differential pick-up which, as is known, comprises two electric elements associated with the same sensor, the characteristics of the electric elements varying in opposite senses but by substantially the same amount with the displacement of the sensor. As can be seen in FIG. 1 the pick-up is formed by a differential capacitor $v_1$, $v_2$ consisting of two elementary capacitors 1, 2 having capacitances $v_1$, $v_2$ which vary according to the displacement of a common armature on sensor shaft 3 which is mounted for axial movement (in the directions of arrows F) in a pick-up body 4 and which has an electrical connection, e.g. to earth 5. The capacitors 1, 2 have values $v_1$, $v_2$ respectively which are identical when the associated sensor shaft 3 is in zero or reference position in which it is shown in FIG. 1. A movement of the shaft 3 corresponds to a decrease of the value of one of the capacitors 1, 2 and an increase of the same increment in value of the other.

The measuring apparatus shown further comprises electronic means whose function is to convert the electric characteristic of the pick-up (i.e. values $v_1$ and $v_2$) of the capacitors 1, 2 to a signal corresponding to the axial displacement of the sensor 3 and thereby to display this displacement.

Briefly, the electronic circuitry of the preferred embodiment comprises: measuring means for furnishing a first, measurement, logic signal or pulse (signal E of FIG. 3), the duration T of which is equal to the sum $av_1 + av_2$ (where $a$ is a constant) of the parameter values — or capacitances — $v_1$ and $v_2$ of each of the elementary capacitors 1 and 2 of the pick-up (see signal B of FIG. 3); reference means for furnishing a second, reference, logic signal or pulse, (see signal F of FIG. 3), the duration T' of which equals twice the measurement $av_1$ of the capacitance $v_1$ of the capacitor 1; synchronising means for rendering the starts of the measurement pulses E and reference pulses F simultaneous; comparison means for generating, from the pulses E and F, a logic comparison pulse G (FIG. 3) the duration T'' of which equals the absolute value of the difference T – T' of the durations T, T' of the pulses E, F; and measuring and displaying means for measuring and indicating a value of displacement of the sensor 3 from the information given by the duration T'' of the comparison pulse G.

Figure 3:
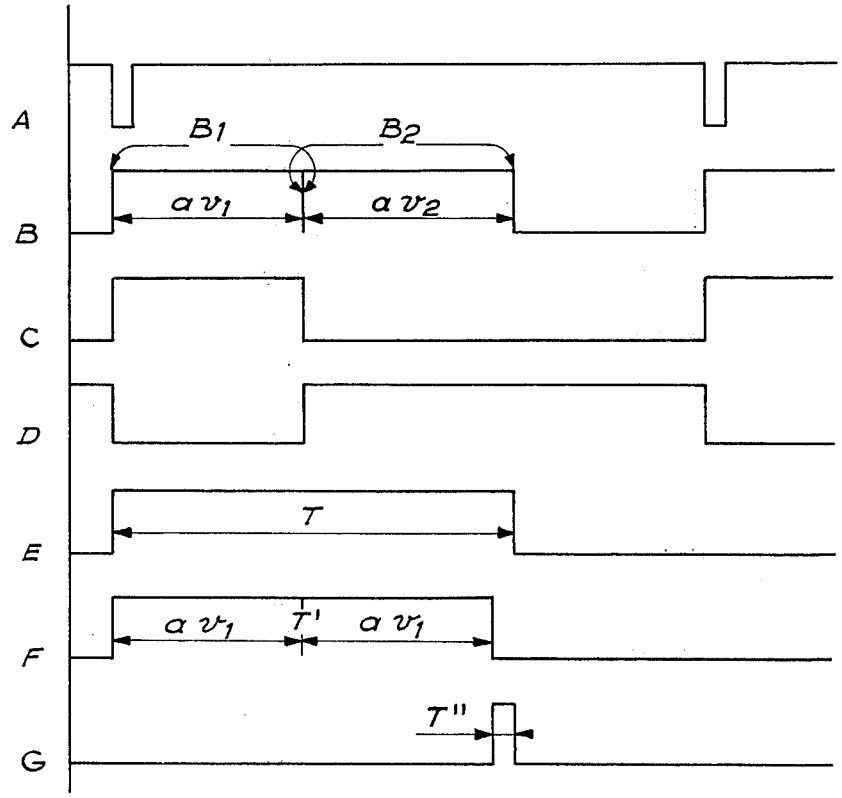
FIG. 3 shows the waveform of the logic signals occurring in use of the apparatus of FIG. 2.

Advantageously the measuring comprise, as is shown by the diagram of FIG. 2, an oscillator circuit 6 which can be connected, via switching means, successively to one or the other of the elementary capacitors 1 and 2 of the pick-up and which is operated in such manner as to form, together with whichever of the capacitors 1, 2 to which it is connected, a measurement pulse generator, furnishing a signal formed of a series of periodic pulses, the frequency of which is a function of the value $v_1$ or $v_2$ of whichever capacitor is switched into circuit. The measuring means further comprise a measurement pulse counter 7 which is actuated to emit, via logic output 7a, a pulse which commences at the beginning of counting as soon as the counter enters into operation (see square wave $B_1$ of the diagram of FIG. 3 representing the signal B appearing at the output 7a of the counter 7), returns to zero at the end of counting with capacitor 1 switched in and immediately recommences and lasts until counting with capacitor 2 finishes. These changes occur when the counter has counted a predetermined number of pulses from the measurement-pulse generator. The switching means are actuated in combination with the measurement counter 7 so as, on the one hand, to switch the second capacitor 2 into the oscillator circuit 6 as soon as the measurement counter 7 has counted the predetermined number of pulses of the measurement generator 6, with the capacitor 1 switched in, and, on the other hand, to control a logic gate 8 connected to the output 7a of the counter 7 so that the output 8a of this gate 8 remains high only while the counter 7 is counting.

For this purpose the switching means are formed by two transistors 9 and 10, the controlled current circuits of which are capable of connecting, respectively, the capacitors 1 and 2 to the oscillator circuit 6. The base of each of the transistors 9 and 10 is connected to the respective output 11a and 11b of a bistable multivibrator 11 which can be switched to one state by applying a signal to input 11c and to the other state (resetting the multivibrator to zero) by the application of a signal to a second, reset input 11d.

When the signal from the logic output 7a of the counter 7 has been inverted by the inverter 100 it is applied, through the intermediary of a coincidence or anti-coincidence logic gate 12 controlled by the state ("0" or "1") of the output 11a of the multivibrator 11, to the input 11c of the said multivibrator 11. The gate 8 is controlled by the state of the second output 11b of the multivibrator 11. The gates 12 and 8 are equivalent to AND gates (gates 8b and 12b are inverters and gates 8c and 12c are NAND gates).

The reference means comprise a clock generator 13 of similar design to that of the measurement generator 6, and the output 13a is connected, through the intermediary of a coincidence or anticoincidence logic gate 14, to the input of an add-and-subtract counter 15 operated in combination with the measuring means 1, 2, 6 and 12 in such manner as to count the pulses emitted by the clock generator 13 during all the duration of the counting by the measurement counter 7 of the pulses generated by the measurement generator and corresponding to the first capacitor 1 being switched into the oscillator 6, and then to subtract the pulses furnished later on by the clock generator 13 until zero value is obtained. The add-and-subtract counter 15 is operated so as to deliver at its output 15a a logic pulse whose duration corresponds to the whole time counter 15 operates (both adding and subtracting).

A logic inverter 16 is connected to the output 15a so as to invert the pulse appearing at the output 15a in order to obtain the pulse F shown in FIG. 3.

Comparison means are provided, comprising an "exclusive OR gate" 17 receiving at its inputs 17a and 17b respectively the measurement pulses E and reference pulses F. The output 17c of the gate 17 is connected to the control terminal of a coincidence logic gate 18 connecting the clock generator 13 to a display counter, the output of which is connected to a numerical display device 20.

Synchronising means for the apparatus are formed, by a resetting-to-zero pulse generator 21, the output of which is connected to the reset-to-zero terminals 7b, 11d, 15b and 19a of the counter 7, the multivibrator 11, the add-and-subtract counter 15 and the display counter 19, as well as to the control terminals of the logic gate 14 and a coincidence logic gate 22 which is capable of being connected to the measurement-pulse generator 1, 2, 6 at the input of the measurement counter 7. Interposed in the connection of the resetting-to-zero generator 21 with the gate 22 is an AND gate 23 which is controlled by the state of the output 8a of the gate 8. In the connection of the generator 21 with the gate 14 there is also interposed an AND gate 24 controlled as a function of the state of the reference pulse F which appears at the output of the inverter 16. An inverter 103 is interposed in the connection of the generator 21 with the resetting-to-zero terminal 15b of the add-and-subtract counter 15. The exclusive OR gate 17 is obtained in conventional manner from inverters 17a and NAND gates 17e.

At the instant $t=o$ the signal A present at the output of the resetting-to-zero pulse generator 21 passes from the state 1 to the state 0 in a very brief time. The passage to the state 0 of A serves to reset to zero the multivibrator 11 ($11a = 1$) and the display counter 19, as well as to return to 1 the least significant bit of the add-and-subtract counter 15.

Thus in the first stage, the capacitor 1 is in connection with the circuit 6 via transistor 9, whose base is placed at a suitable corresponding potential, in this case the 1 state of the output 11a of the multivibrator. The output pulses of the measurement pulse generator 6 pass through the open gate 22 to the counter 7. Simultaneously the clock generator 13 sends pulses through the open gate 14 to the add-and-subtract counter 15 which at this time is set to "ADD".

In a second stage, when the maximum recording value (predetermined number of pulses) of the counter 7 has been reached the count held in counter 7 is automatically returned to zero. The signal B appearing at the output 7a passes from 1 to 0 (square wave $B_1$) and will permit the change of state of the multivibrator 11 so that the state of the output 11a is 0 and the state of the output 11b is 1. This will switch the capacitor 2 into the circuit 6 and alter the function of the counter 15 from "ADD" to "SUBTRACT" through connection 101.

The signal E present at the output 8a of the gate 8 is in the 1 state as is the signal F; the latter signal will return to zero when the subtracting of the counter 15 has permitted the value 0 to be reached.

The signal G (output 17c of the gate 17), via gate 18 enables the pulses from the clock generator 13 to be fed to the display counter 19. The signal G is obtained at the output of the "exclusive OR" circuit 17 from the signals E and F; the duration T" of the signal G will thus be the difference between the duration T, T' of each of the signals E and F.

When the counter 7 arrives at the end of adding, the signal B passes from the 1 state to the 0 state and consequently changes the state of the multivibrator 11 (11b=1). As a result the add-and-subtract counter 15 passes to subtracting function, and capacitor 2 is then connected to the oscillator circuit 6; the counter 7 starts again on a second counting cycle. The duration $av_2$ of this fresh cycle may be longer or shorter than the first cycle $(a,v_1)$ since the value $(v_2)$ of the capacitor 2, which may be different from that $(v_1)$ of the capacitor 1, thereby causing a difference in the frequency of the pulses from the measurement generator. However, the add-and-subtract counter 15 which is still being supplied by the clock generator 13 takes the same time $av_1$ to return to zero as it took to arrive at the state in which it was at the instant of change from adding to subtracting function.

At the moment when the add-and-subtract counter 15 reaches the value 0, the signal F passes from 1 to 0 and the "exclusive OR" circuit 17 opens the gate 18 of the display counter 19, until the moment when the signal B returns to zero, indicating the end of the counting of the counter 7. The time during which gate 18 of the display counter 19 is open thus corresponds to the difference of the times T - T' between the first filling time T of the counter 7 corresponding to the capacitor 1 being connected to the generator 6 and the second filling time T' corresponding to the capacitor 2 being so connected. A number of pulses representing the dimension which has been measured reaches the display counter 19 via the gate 18 and the read-out or display device 20 which displays the state of this counter.

By virtue of the similarity of production — or design concept — of the measurement generator 6, and the clock generator 13, the symmetry of the operating mode of these generators and of the capacitors 1, 2 errors may thus be reduced to a very acceptable value.

We claim:

1. An apparatus for measuring a parameter comprising first and second electrical elements which have respective electrical characteristics that vary by substantially the same amount but in opposite senses in response to a variation in the value of said parameter; first pulse generator means operable to produce a first pulse having a length proportional to the value of the electrical characteristic of said first element; second pulse generator means operable to produce a second pulse having a length proportional to the value of the electrical characteristic of said second element; and signal processing means connected to said first and second pulse generator means and responsive thereto to produce a third pulse having a length corresponding to the absolute value of the difference between the lengths of said first and second pulses, whereby the length of said third pulse represents the value of the parameter measured.

2. An apparatus according to claim 1, wherein the parameter to be measured is a spatial displacement and the first and second electrical elements are spatial displacement transducers.

3. An apparatus according to claim 2, wherein the first and second electrical elements are elementary capacitors which share a common armature and together therewith comprise a differential capacitor.

4. An apparatus according to claim 1, and including means to initiate operation of said means for producing the second pulse immediately upon termination of the first pulse.

5. An apparatus according to claim 4, and further comprising means for producing a fourth pulse whose length is equal to twice that of the first pulse and means to synchronize the start of said fourth pulse with that of the first pulse.

6. An apparatus according to claim 5, and further comprising means for comparing the length of said fourth pulse with the sum of the first and second pulses thereby to produce said third pulse.

7. An apparatus according to claim 6, wherein said means for producing the fourth pulse comprises adder/subtractor counting means operable to count in one direction for the duration of the first pulse and to start counting in the other direction at the same rate to its original starting value as soon as the first pulse has ended, said adder/subtractor counting means having an output producing an output pulse only while the adder/subtractor counting means is counting.

8. An apparatus according to claim 7, and further comprising reference-pulse generating means, and means to connect the adder/subtractor counting means to the reference-pulse generating means so as to count pulses therefrom.

9. An apparatus according to claim 1, and further comprising output counting means operable to be driven with counting pulses for the duration of the third pulse.

10. An apparatus according to claim 9, and further comprising numerical display means connected to the output counting means.

11. An apparatus according to claim 1, and further comprising pulse generating means and switching means, the switching means being operable alternately to connect the first and second electrical elements to the pulse generating means, the pulse generating means having an output frequency which depends on the said parameter sensitive electrical characteristic of whichever of the electrical elements is switched into connection with it.

12. An apparatus according to claim 11 and further comprising counting means connected to the pulse generating means for counting pulses therefrom, the counting means being operable to terminate counting when a predetermined number of pulses has been counted, the counting means having an output for producing an output pulse which lasts only while the counting means is counting.

13. An apparatus according to claim 12, wherein said switching means has an input connected to the output of the counting means and is operable firstly to connect the first electrical element with the pulse generating means, and, when the counting means has counted said predetermined number of pulses, to connect the second electrical element with the pulse generating means.

14. A method of measuring a parameter comprising the steps of: taking first and second electrical elements which have respective electrical characteristics which vary by substantially the same amount but in opposite senses in response to the variation in the value of the parameter; producing a first pulse whose length is proportional to the parameter-sensitive electrical characteristic of the first element; producing a second pulse whose length is proportional to the parameter-sensitive electrical characteristic of the second element, and producing a third pulse whose length corresponds to the absolute value of the difference between the length of the first and second pulses and thereby represents the value of the parameter measured.

* * * * *